US012662735B2

(12) United States Patent (10) Patent No.: US 12,662,735 B2
Arnoult (45) Date of Patent: Jun. 23, 2026

(54) SILICON OXIDE COATED POLYMER FILMS AND LOW PRESSURE PECVD METHODS FOR PRODUCING THE SAME

(71) Applicant: AGC GLASS EUROPE, Louvain-la-neuve (BE)

(72) Inventor: Gregory Arnoult, Noville-les-Bois (BE)

(73) Assignee: AGC GLASS EUROPE, Louvain-la-neuve (BE)

( * ) Notice: Subject to any disclaimer, the term of this patent is extended or adjusted under 35 U.S.C. 154(b) by 104 days.

(21) Appl. No.: 17/787,286

(22) PCT Filed: Dec. 18, 2020

(86) PCT No.: PCT/EP2020/087042
§ 371 (c)(1),
(2) Date: Jun. 17, 2022

(87) PCT Pub. No.: WO2021/123183
PCT Pub. Date: Jun. 24, 2021

(65) Prior Publication Data
US 2023/0054056 A1 Feb. 23, 2023

(30) Foreign Application Priority Data
Dec. 19, 2019 (EP) ..................................... 19217863

(51) Int. Cl.
| | |
|---|---|
| *C23C 16/50* | (2006.01) |
| *C23C 16/40* | (2006.01) |
| *C23C 16/54* | (2006.01) |
| *H05H 1/48* | (2006.01) |

(52) U.S. Cl.
CPC ............ *C23C 16/50* (2013.01); *C23C 16/401* (2013.01); *C23C 16/545* (2013.01); *H05H 1/481* (2021.05); *H05H 2245/42* (2021.05)

(58) Field of Classification Search
CPC ..... C23C 16/401; C23C 16/50; C23C 16/545; H05H 1/481; H05H 2245/42
USPC ......................................... 427/579
See application file for complete search history.

(56) References Cited

U.S. PATENT DOCUMENTS

| | | | | |
|---|---|---|---|---|
| 5,147,826 A * | 9/1992 | Liu | ................... | H01L 21/02576 |
| | | | | 117/930 |
| 5,888,593 A * | 3/1999 | Petrmichl | ............. | C23C 16/513 |
| | | | | 427/574 |
| 6,444,945 B1 * | 9/2002 | Maschwitz | ....... | H01J 37/32009 |
| | | | | 219/121.36 |
| 7,411,352 B2 * | 8/2008 | Madocks | ................ | C23C 14/32 |
| | | | | 315/111.41 |
| 8,652,586 B2 * | 2/2014 | Maschwitz | ........... | C03C 17/245 |
| | | | | 427/571 |
| 9,431,218 B2 * | 8/2016 | Zhao | ................. | H01J 37/32596 |
| 9,721,765 B2 * | 8/2017 | Chambers | ......... | H01J 37/32568 |

(Continued)

OTHER PUBLICATIONS

International Search Report mailed on Apr. 23, 2021 in PCT/EP2020/087042 filed on Dec. 18, 2020 (3 pages).

*Primary Examiner* — Brian K Talbot
(74) *Attorney, Agent, or Firm* — Oblon, McClelland, Maier & Neustadt, L.L.P.

(57) ABSTRACT
A stress-free transparent silicon oxide coated polymer substrates and a method for depositing a stress-free transparent silicon oxide based layer on polymer substrates using a PECVD device including at least one hollow cathode plasma source.

19 Claims, 2 Drawing Sheets

(56)            References Cited

U.S. PATENT DOCUMENTS

| | | | |
|---|---|---|---|
| 2004/0155592 A1* | 8/2004 | Madocks ................ | C23C 16/50<br>204/192.12 |
| 2005/0003104 A1* | 1/2005 | Neumann ............. | C23C 14/568<br>427/255.7 |
| 2009/0065056 A1* | 3/2009 | Upadhayaya ......... | H10F 71/121<br>427/578 |
| 2010/0024729 A1* | 2/2010 | Cao ..................... | C23C 16/5096<br>118/723 R |
| 2010/0028238 A1* | 2/2010 | Maschwitz ......... | C03C 17/2456<br>315/111.41 |
| 2014/0099451 A1* | 4/2014 | Mahieu ................ | C23C 16/402<br>427/579 |
| 2016/0293609 A1* | 10/2016 | Jha .................... | H01L 21/02274 |
| 2017/0036948 A1* | 2/2017 | Hanekawa .......... | C03C 17/2456 |
| 2017/0338083 A1* | 11/2017 | Chambers ......... | H01J 37/32596 |
| 2018/0025892 A1* | 1/2018 | Biquet ................... | H05H 1/481<br>427/569 |
| 2020/0350144 A1 | 11/2020 | Chambers et al. | |
| 2022/0018021 A1* | 1/2022 | Arnoult ............ | H01J 37/32577 |
| 2024/0279811 A1* | 8/2024 | Arnoult ................ | D06M 10/10 |

* cited by examiner

SILICON OXIDE COATED POLYMER FILMS AND LOW PRESSURE PECVD METHODS FOR PRODUCING THE SAME

TECHNICAL FIELD

The invention relates to stress-free transparent silicon oxide coated polymer substrates. The invention further relates to a method for depositing a stress-free transparent silicon oxide based layer on polymer substrates, in particular on thin polymer films, more particularly on polyethylene terephthalate (PET) based thin polymer films, and for promoting the adhesion of lamination materials to the polymer substrate. In particular the method is adapted for use in a continuous coating process.

BACKGROUND ART

Silicon oxide based layers may be used on polymer substrates for different purposes. They may be used as barrier layers against water vapor or gases. They may also be part of a more complex stack of multiple layers that are used to modify the optical or opto-energetical properties of a polymer film, such as antireflecting layer stacks, low emissivity insulating layer stacks or solar control layer stacks for example. They may also be used for improving the adhesion of the polymer substrate to other substrates or adhesives or to other coating layers.

To produce silicon oxide based layers, so-called PECVD methods (plasma enhanced chemical vapor deposition) may be used. These methods can be used when coating many different substrates for various layer materials. Frequent issues encountered with polymer substrates are the increase of the substrate temperature and the etching of the polymer substrate's surface by the plasma's reactive species. For example, it is known to deposit $SiO_2$ layers and $Si_3N_4$ layers at a thickness of 20 to 30 nm on 13 μm of PET substrates with microwave-excited and/or radio-frequency plasma enhanced PECVD. While interesting barrier properties are obtained, the dynamic deposition rate for coatings of 200 nm thickness below 10 nm m $min^{-1}$ is very low. [A. S. da Silva Sobrinho et al., J. Vac. Sci. Technol. A 16(6), November/December 1998, p. 3190-3198].

When depositing silicon oxide for transparent barrier layers on PET substrates by means of PECVD, oxygen barrier and water vapor barrier properties may be achieved [R. J. Nelson and H. Chatham, Society of Vacuum Coaters, 34th Annual Technical Conference Proceedings (1991) p. 113-117 and M. Izu, B. Dotter, S. R. Ovshinsky, Society of Vacuum Coaters, 36th Annual Technical Conference Proceedings (1993) p. 333-340].

Disadvantages of the known PECVD methods are, above all, that their deposition rates are too low for being used in processes where the substrate travels through one or more deposition processes at high speed, for instance in high speed roll-to-roll processes. Furthermore, in known PECVD processes, higher deposition rates tend to lead to higher substrate temperatures, thus limiting the maximum deposition rate and/or necessitating additional cooling means for the polymer substrate. Furthermore the adhesion of these coatings to the polymer substrate tends to be low and/or the intrinsic compressive stress in the coatings is frequently high, leading to deformation of the coated PET substrate.

Furthermore, it is known to apply silicon oxide based layers by means of sputtering. A disadvantage of sputtered layers is their high costs, which are caused by the low productivity, that is low dynamic deposition rate, of the silicon oxide sputtering process. More importantly for thin polymer films, at any but the smallest thicknesses, the intrinsic compressive stress of sputtered silicon oxide based coatings leads to deformation of the coated thin film polymer substrates.

SUMMARY OF INVENTION

One of the objectives of the present invention is to obtain silicon oxide based layers on polymer substrates, in particular on polymer films by the use of a low-pressure PECVD process, which pressure may be for the present application between 0.005 and 0.025 Torr, allowing one or more of the following: high deposition rates, highly transparent silicon oxide based films, and minimizing the amount of stress in the coating, in particular to minimize deformation of the coated thin polymer substrate and to minimize the risk of delamination.

The invention also relates to a process for the production of layers based on silicon oxide on polymer substrates, in particular on thin polymer films, by the PECVD method, comprising the stages consisting in:
  a. providing a polymer substrate
  b. providing a low-pressure PECVD device comprising at least one linear hollow-cathode plasma source, each source comprising at least one pair of electrodes connected to an AC, DC or pulsed DC generator, for the deposition of said films on the substrate,
  c. applying an electrical power to the plasma source, so that the power density of the plasma is between 3 kW and 15 kW per linear meter of plasma source, and,
  d. applying, to the polymer substrate, a gaseous precursor of oxides of silicon at a flow rate of between 50 and 700 sccm per linear meter of the plasma source, the gaseous precursor being injected in between the electrodes of each electrode pair and in between the two pairs of electrodes and a reactive gas based on oxygen or on oxygen-comprising derivatives at a flow rate of between 1500 and 4000 sccm per linear meter of the plasma source, the reactive gas being injected in the electrodes of the hollow cathode plasma source.

The invention further relates to a silicon oxide based layer that may be made by the process of the present invention or any embodiment of this process or any combination of embodiments of this process.

The invention further relates to a polymer substrate coated with a silicon oxide based layer of the present invention, coated polymer substrate that may be made by the process of the present invention or any embodiment of this process.

High dynamic deposition rates may be obtained by the process of the present invention. In particular, by the use of the process, it is possible to obtain, at high dynamic deposition rates, silicon oxide based layers which strongly adhere to the polymer substrate. Furthermore the thus coated substrate may present a limited amount of deformation. The inventor has found that this is possible by the necessary combination of a linear hollow cathode PECVD device, specific power densities of the plasma and when, preferably, the ratio of the flow rate of reactive gas to the flow rate of gaseous precursor is at least that necessary to obtain said layers. Said layers, when deposited on a polymer substrate, may also be optimized regarding their optical properties, in particular regarding transmittance. The silicon oxide based layers deposited by the process of the present invention present low stress and the substrate is submitted to low thermal load during the coating process. It is believed that the resulting coated substrate presents low levels of deformation for these reasons as well as high levels of coating adhesion.

The PECVD process of the present invention exhibits one or more of the processing advantages listed above: high dynamic deposition rates of at least 200 nm×m/min, ease of processing on the industrial scale, excellent uniformity of the layers obtainable (thickness variations<5%), low amount of heat transfer to the polymer substrate, in particular in the absence of substrate cooling, low deformation of the polymer substrate, in particular of thin polymer film substrates, and moderate costs of the installations.

BRIEF DESCRIPTION OF DRAWINGS

These and further aspects of the invention will be explained in greater detail by way of example and with reference to the accompanying drawings in which.

The figures are not drawn to scale.

DESCRIPTION OF EMBODIMENTS

The process requires a low-pressure PECVD device, operated in an enclosure at a pressure preferably between 0.005 and 0.025 Torr, preferably between 0.010 and 0.020 Torr and more preferably between 0.013 and 0.015 Torr, which device is provided with a linear hollow-cathode plasma source connected to an AC, or pulsed DC generator, the frequencies of which are advantageously between 5 and 150 kHz, preferably between 5 and 100 kHz, or to a DC generator.

A PECVD device example is described below. The PECVD device may be provided in a vacuum chamber. This vacuum chamber is preferably arranged so that it makes it possible to have, next to one another, different devices providing different deposition forms or surface treatments. In certain cases, these devices, which make possible different deposition forms, are flat or rotating cathodes for magnetron sputtering depositions. This vacuum chamber may in particular be combined with means to transport the substrate. In particular this vacuum chamber may be combined with means to transport thin polymer films along each deposition device in a roll-to-roll manner.

The PECVD device of the present invention may be composed of a hollow cathode plasma source comprising, for example, at least one pair of electrodes connected to an AC or pulsed DC generator, in which discharge takes place, and openings in the electrodes from where the plasma is expelled. In a preferred embodiment the hollow cathode plasma source comprises at least two, at least three or at least four pairs of electrodes. Each electrode or cavity is connected to a pipe which makes it possible to introduce, into the cavity, a gas or gas mixture which will be ionized when the discharges takes place.

Figure 1:
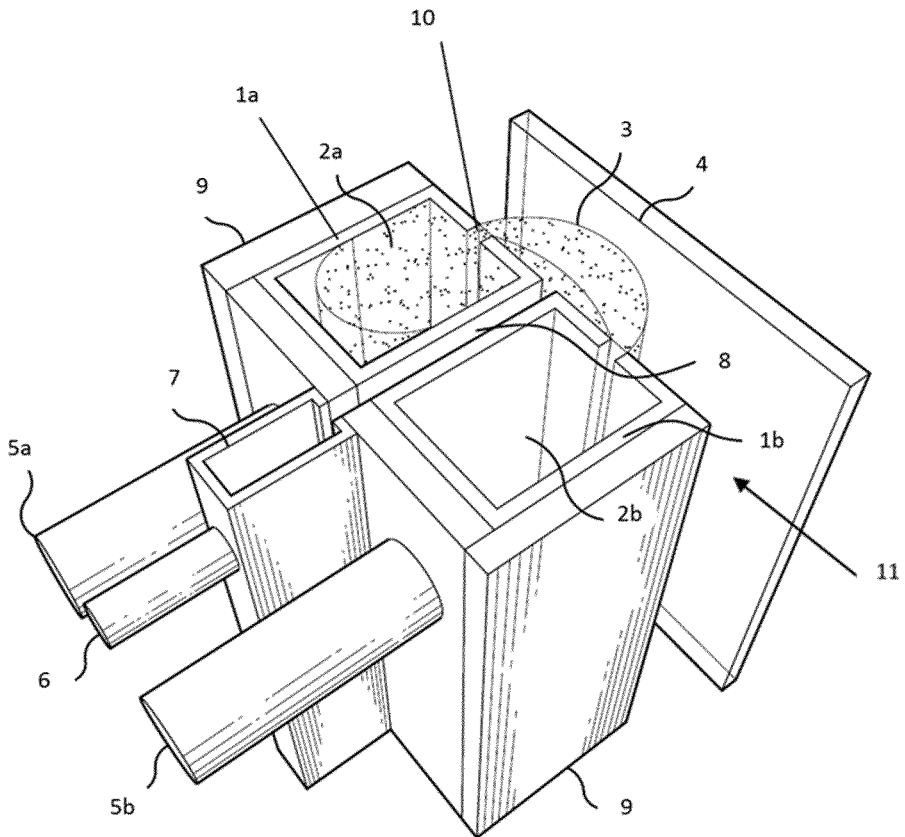
FIG. 1, shows a schematic cross section of a low-pressure PECVD device comprising one linear hollow-cathode plasma source, comprising one pair of electrodes coating a polymer substrate coated with a silicon oxide.

"PECVD device comprising a linear hollow cathode plasma source" is taken to mean a linear plasma enhanced chemical vapor deposition source comprising one or more pairs of electrodes configured to produce hollow cathode discharges. One example of a hollow cathode plasma source is described in U.S. Pat. No. 8,652,586 to Maschwitz, incorporated herein by reference in its entirety. FIG. 1 shows a plasma source of hollow cathode type that may be used in the present invention. The plasma source comprises at least one pair of linear hollow cathode electrodes (1a) and (1b), arranged in parallel, side-by-side, and connected via an AC power source (not shown). Electrically insulating material (9) is disposed around the hollow cathode electrodes. The plasma generating gas is supplied via the inlets (5a) and (5b). The precursor gas is supplied via the precursor gas inlet (6) and led through manifold (7) and precursor injection slot (8) in the dark space between the electrodes, into the plasma curtain (3). The AC power source supplies a varying or alternating bipolar voltage to the two electrodes. The AC power supply initially drives the first electrode to a negative voltage, allowing plasma formation, while the second electrode is driven to a positive voltage in order to serve as an anode for the voltage application circuit. This power supply then drives the first electrode to a positive voltage and reverses the roles of cathode and anode. As one of the electrodes is driven negative (1a), a discharge (2a) forms within the corresponding cavity. The other electrode then forms an anode, causing electrons to escape the plasma through the outlet (10) and travel to the anodic side, thereby completing an electric circuit. A plasma having a curtain shape (3) is thus formed in the region between the first and the second electrodes, along the length of the electrodes, above the substrate (4). Substrate (4) is presently illustrated as a single sheet of polymer, it may however also be in the shape of a long ribbon, for instance in a roll-to-roll type coating device. This method of driving hollow cathodes with AC power contributes formation of a uniform linear plasma that spans across the polymer substrate, perpendicular to the travelling direction (11) of the polymer substrate. For the purpose of the present patent, the electron emitting surfaces of the electrodes may also be called plasma generating surfaces.

"Closed circuit electron drift" is taken to mean an electron current caused by crossed electric and magnetic fields. In many conventional plasma forming devices the closed circuit electron drift forms a closed circulating path or "racetrack" of electron flow. Hollow cathode PECVD devices of the present invention operate in the absence of closed circuit electron drift.

"AC power" is taken to mean electric power from an alternating source wherein the voltage is changing at some frequency in a manner that is sinusoidal, square wave, pulsed or some other waveform. Voltage variations are often from negative to positive, i.e. with respect to ground. When in bipolar form, power output delivered by two leads is generally about 180° out of phase.

"Electrodes" provide free electrons during the generation of a plasma, for example, while they are connected to a power supply providing a voltage. The two electron-emitting surfaces of a hollow cathode are considered, in combination, to be one electrode pair. Electrodes can be made from materials well-known to those of skill in the art, such as steel, stainless steel, copper, or aluminum. However, these materials should be carefully selected for the plasma-enhanced deposition process, as different gasses may require different electrode materials to ignite and maintain a plasma during operation. It is also possible to improve the performance and/or durability of the electrodes by providing them with a coating.

The PECVD device may in particular be adapted for use in a continuous coating process, where the substrate is not stationary below the PECVD device but continuously moves beneath the PECVD device. Substrates may in particular travel in a direction perpendicular to the length of the plasma source.

The power density of the plasma is defined as being the power dissipated in the plasma generated at the electrode(s), with reference to the size of the plasma.

The "linear meter of plasma", also referred to here as "total length of the plasma", is defined as the distance between the ends of the plasma generated by a pair of electrodes, in the direction transversal to the travelling direction of the polymer substrate to be coated. When the plasma source comprises more than one pair of electrodes, the total length of the plasma is defined as the sum of the distances between the ends of the plasmas generated by each pair of electrodes, in the direction transversal to the travelling direction of the polymer substrate to be coated.

In a linear hollow-cathode plasma source, the "power density of the plasma" can be defined as the total power applied to the source, divided by the total length of the plasma.

According to the present invention, a reactive gas based on oxygen $O_2$ or on oxygen-comprising derivatives may be used, the latter preferably being chosen from the group consisting of ozone, hydrogen peroxide, water and $CO_2$. According to embodiments, the reactive gas can in addition advantageously include an inert gas, such as helium, nitrogen, argon, neon or krypton, in order to promote the chemical dissociation of the precursors and to control the ion bombardment by the source. In an advantageous embodiment the reactive gas is chosen among $O_2$ or an $O_2$-inert gas mixture, for instance a $O_2$—Ar mixture. An amount of such an ionizable reactive gas or gas mixture is introduced at a certain flow rate into the cavities of the plasma source's electrodes, and may be controlled by mass flowmeters which may be placed on pipes between the gas reservoirs and the plasma source. When $O_2$-inert gas mixtures are used, the ratio of $O_2$ to inert gas, for instance of $O_2$ to Ar, is defined by the ratio of the flow rate of $O_2$ to the flow rate of the inert gas and is located in the range of 2 to 50, preferably of 10 to 30, very advantageously of 15 to 25.

The precursor gas of oxides of silicon is injected, preferably in a uniform manner, along the length of plasma source, preferably at least in between any two electrodes of an electrode pair of the plasma source. This precursor gas is activated when entering into contact with the plasma. The substrate is taken close to the plasma source and, being thus exposed to the activated precursor, a thin layer based on silicon oxide is deposited on the substrate from the activated precursor gas. The precursor gas may be gaseous under standard conditions of temperature and pressure, that is about room temperature and atmospheric pressure. The precursor gas may also be a precursor that is a solid or preferably a liquid under standard conditions of temperature and pressure and that has been vaporized.

The amounts, i.e. flow rates, of reactive gas or gas mixture and precursor gas injected into the plasma are controlled for example by a liquid or vapor mass flowmeter.

The working pressure range for the plasma source is advantageously between 0.005 and 0.025 Torr. The PECVD device for the process of the present invention is advantageously provided in a vacuum chamber maintained at a pressure between 0.005 and 0.025 Torr, pressure which may be maintained by vacuum pumping means, while injecting the various reactant and precursor gases. Vacuum pumping is preferably provided by turbomolecular pumps, connected to the vacuum chamber enclosing the plasma source, preferably configured to provide uniform gas flow upstream and downstream of the PECVD device. Preferably the pumping is provided at least on the side of the substrate being coated. Optionally pumping is additionally provided on the side of the substrate opposite of the side being coated.

In certain embodiments of the invention, the ratio of reactive gas to the precursor gas is sufficient to transform at least all C, H, and Si of the precursor molecule to $CO_2$, $H_2O$, and $SiO_2$. In particular the ratio oxygen atoms of the reactive gas to molecule of precursor is at least 2 O atoms per precursor molecule, advantageously between 5 and 30 O atoms per precursor molecule.

Furthermore in an advantageous embodiment of the present invention the amount of oxygen or oxygen containing derivative is at least sufficient to potentially transform all carbon, hydrogen and/or silicon of the precursor into $CO_2$, $H_2O$ and $SiO_2$. That is, if the carbon, hydrogen and silicon containing portion of the precursor is noted as $C_xH_ySi_z$ the amount q of oxygen atoms provided is preferably at least $q=2x+0.5y+2z$. Indeed it was found that for lower amounts of oxygen, absorption increased in the silicon oxide based films.

More specifically, the ratio of the power per linear meter of the plasma source, that is the power density, to the pressure in the vacuum chamber, is advantageously not greater than 1.5 (kW/m)/mTorr, more advantageously not greater than 0.9 (kW/m)/mTorr, more advantageously not greater than 0.8 (kW/m)/mTorr. It was found that, by limiting this power to pressure ratio, the temperature rise of the substrate remained very moderate during the coating process. In particular, the substrate temperature may be maintained at a temperature not exceeding 60° C., advantageously not exceeding 50° C., more advantageously not exceeding 45° C., in particular in the absence of additional substrate cooling means.

In other words, in certain embodiments of the present invention, by controlling the power density to pressure ratio as explained above, the rise of substrate temperature due to the process of the present invention, in the absence of additional substrate cooling means is less than 40° C., advantageously less than 30° C., more advantageously less than 25° C. Substrate temperature may be measured using thermocouples or else estimated using irreversible temperature monitoring labels.

In certain embodiments of the invention, the temperature to which the substrate is brought by the PECVD process is at least 20° C., alternately at least 25° C., alternately at least 30° C. The temperature, to which the substrate is brought, is maintained throughout the coating process in the absence of cooling means for the substrate.

In certain embodiments of the present invention, the ratio of the power per linear meter of the plasma source to the pressure in the vacuum chamber is advantageously at least 0.2 (kW/m)/mTorr, more advantageously at least 0.4 (kW/m)/mTorr, more advantageously at least 0.6 (kW/m)/mTorr. It was found that substrate etching damage was very limited or even completely absent under these conditions.

Additional other coating processes or surface treatment processes may of course require substrate cooling means that are remote from the PECVD device or close to the PECVD device.

Preferably, in any embodiment of the present invention, the source of the PECVD device may have dimensions of between 250 mm and 4000 mm in length and between 300 and 600 mm in width per pair of electrodes.

In any embodiment of the present invention, power density is applied between the two electrodes so that the power density may be between 1 and 50 kW per linear meter of plasma, preferably between 2 and 30 kW per meter of plasma, more preferably between 3 and 15 kW per linear meter of plasma. Above 50 kW per m of plasma sometimes the formation of powder in the gas phase prejudicial to the quality of the deposition is observed.

The silicon oxide precursors that may be used in any embodiment of the present invention depend on the nature of the layer which will be deposited. These are gaseous or volatile products, in particular at the temperatures and pressures at which the process is carried out. The precursors of silicon oxide are typically $SiH_4$ (silane), TMDSO (tetramethyldisiloxane) and HMDSO (hexamethyldisiloxane) this list not being exhaustive.

The flow rate of the gaseous precursor is between 50 and 700 sccm (standard cubic centimeters per minute) per linear meter of the plasma source, preferably between 150 and 500 sccm or between 200 and 500 sccm per linear meter of the plasma source. This range is necessary in order to obtain high degrees of deposition appropriate to this technique, preferably of the order of 200 to 400 nm×m/min.

The present invention furthermore concerns a silicon oxide based layer, in particular deposited using any embodiment or combination of embodiments of the process of the present invention.

The present invention also concerns a polymer coated at least in part by a silicon oxide based layer of the present invention.

The silicon oxide based layers of the present invention may be so that their geometric thickness is between 2 and 1500 nm, preferably between 20 and 800 nm, in particular between 30 and 600 nm. The chosen thickness depends on the technical effect desired for the substrates thus coated.

In certain embodiments of the present invention, the silicon oxide based layer is in direct contact with the polymer substrate. In certain other embodiments of the present invention, the silicon oxide based layer of the present invention there are other layers in between the polymer substrate and the silicon oxide based layer.

Preferably, the silicon oxide based layers of the present invention comprise x being between 0 and 0.5. In certain embodiments the silicon oxide based layers comprise or essentially consist of $SiO_2$. The silicon oxide based layers of the present invention may comprise up to 10 atom % of precursor residues, in particular from the group consisting of H, C, N, CI, CH, derivatives, $NH_y$ derivatives and $OH_y$ derivatives, y being between 1 and 4. This content is preferably determined by photoelectron spectroscopy XPS or by secondary ionization mass spectrometry SIMS; it can also be determined by Raman spectroscopy, by ion beam analysis analytical techniques, such as NRA and RBS, and others.

The silicon oxide based layers of the present invention are amorphous and homogeneous throughout the layer thickness, as may be determined by cross-sectional transmittance electron microscopy (TEM). In particular, there is no detectable transition in the silicon oxide based layer from a composition comprising more organic residues to a composition of devoid of any organic residues.

The polymer substrates of the present invention may be polymer be homogeneous sheets of polymer, but other shapes are also possible. They may be free of fibres. Alternately they may comprise glass fibres in an otherwise homogeneous matrix of polymer. In particular they may be not fibre based fabrics or textiles. The silicon oxide based layer may be present on at least a part of the polymer, for instance on one face of a polymer sheet, or on the entirety of the polymer substrate.

The polymer substrate of the present invention may comprise acrylic polymers, polymethylmethacrylate (PMMA) and its copolymers, CR-39 or allyl diglycol carbonate (ADC), polycarbonate, poly propylene (PP), biaxially oriented polypropylene (BOPP), Polyethylene (PE), Polyvinylchloride (PVC) polyethylene terephthalate (PET), polystyrene, cyclic olefin co-polymers (COC's) and polyethylene terephthalate glycol (PETG), and combinations of the foregoing. Polymer substrates of the present invention may comprise thermoplastic elastomers (TPE), sometimes referred to as thermoplastic rubbers, which are a class of copolymers or a physical mix of polymers, usually a plastic and a rubber, that consist of materials with both thermoplastic and elastomeric properties. In particular the polymer substrates may comprise Styrenic block copolymers, TPS (TPE-s), Thermoplastic polyolefinelastomers, TPO (TPE-o), Thermoplastic Vulcanizates, TPV (TPE-v or TPV), Thermoplastic polyurethanes, TPU (TPU), Thermoplastic copolyester, TPC (TPE-E), Thermoplastic polyamides, TPA (TPE-A).

Figure 2:
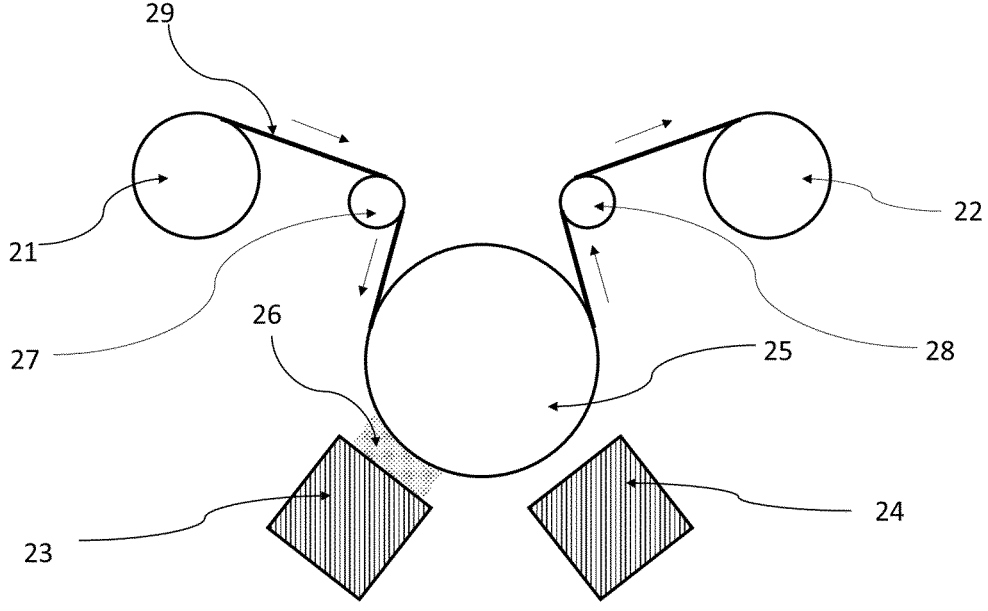
FIG. 2 shows a cross section of a roll-to-roll coating device for performing the process of the present invention.

The polymer substrate may be a thin polymer film, having a thickness comprised between 5 μm and 300 μm, alternately between 10 and 250 μm, alternately between 20 and 200 μm, alternately between 25 and 150 μm. These polymer thin films may be processed in a roll-to-roll manner, as shown for example in FIG. 2. In FIG. 2, the polymer film substrate (29) is unwound from unwind roll (21) redirected over roll (27) towards main roll (25) where the coating process of the present invention takes place. The polymer film is then directed over roll (28) to be wound onto rewind roll (22). The coating process of the present invention is performed using the PECVD device (23) which generates a plasma (26) at the surface of the polymer substrate wherein a silicon oxide precursor is activated so as to form a silicon oxide coating on the polymer film substrate. The arrows in FIG. 2 indicate the moving direction of the thin polymer film. The direction of the film may be reversed so as to repeat the coating process with the polymer films substrate moving in the opposite direction from before. Additional surface treatment or coating devices (24) may be placed in the vicinity of the PECVD device of the present invention. These polymer thin films may in particular comprise PET, PMMA.

The applications of this process are related to the nature of the layer deposited on the substrate. Various embodiments of the invention, for different applications, are described below.

The substrate is very advantageously a normal polymer substrate or polymer film, such as polyethylene-derived polymer films. In the context of the invention, the substrate can also be a substrate which is already precoated with another layer, for example also having barrier layer properties.

In FIG. 1, the PECVD device represented is a linear dual-beam plasma source (10), comprising two cavities (13) in which discharge takes place and openings (14) from where it is expelled. Each cavity includes an electrode (12) connected to a power generator (11) which produces either alternating current (AC) or pulsed DC. The plasma source includes a series of magnets (15) which face one another and which line the cavity. The gas injected into each cavity is thus ionized and forms an ion beam; it forms what is known as a source of plasma (16) which is emitted out of the source via an opening (14) in the direction of the substrate to be coated (30). The arrow indicates the direction of forward progression of the substrate during the deposition. The total width of the plasma is represented by "w" and its total length is for its part measured perpendicularly, that is to say in the direction transversal to the travelling direction of the substrate.

It is noted that the invention relates to all possible combinations of features recited in the claims.

For the purpose of the present invention, value ranges indicated as being between to boundary values are meant to include those boundary values.

EXAMPLES

Silicon oxide based coatings were deposited on sheets of PET of different thicknesses, using different precursors as shown below. The size of the sheets was about 210 mm×297 mm. The PECVD device used a hollow cathode plasma source comprising two pairs of electrodes having each a length of 40 cm. The total length of the generated plasma is thus 2×40=80 cm.

The indicated flow rates in sccm are calculated for a temperature of 273.15 K (0° C., 32° F.) and an absolute pressure of $10^5$ Pa (100 kPa, 1 bar).

Temperature was checked using THERMAX® irreversible temperature monitoring labels that were sensitive in the 37-65° C. temperature range.

The precursor used was $SiH_4$ for examples 1 to 15 and TMDSO for examples 16 to 31. The substrate was affixed to a 4 mm glass sheet and transported at a continuous speed on a roller conveyor beneath the PECVD source in a direction transversal to the length of the source. The reactant in Examples 1 to 31 was $O_2$. Other deposition parameters are given in Table 1 below.

Table 2 below shows the power/pressure ratio, the substrate temperature, the coating thickness and the transmittance, measured with illuminant D65 at a 2° observer angle. Coating thickness was measured using a Dektak® stylus profiler at the edge of an area of the substrate that was masked during deposition of the coating.

TABLE 2

| Example | Power to pressure ratio [(kW/m)/ mTor] | Substrate temperature [° C.] | etching damage | Coating thickness [nm] | Transmittance [D65/2°] |
|---|---|---|---|---|---|
| 1 | 0.5 | <37 | none | 295 | 92.33 |
| 2 | 0.5 | <37 | none | 187 | 89.14 |
| 3 | 0.5 | <37 | none | 102 | 93.01 |
| 4 | 0.5 | <37 | none | 271 | 91.02 |
| 5 | 0.5 | <37 | none | 191 | 87.77 |
| 6 | 0.5 | <37 | none | 91 | 91.83 |
| 7 | 0.5 | <37 | none | 547 | 89.29 |
| 8 | 0.5 | <37 | none | 275 | 90.78 |
| 9 | 0.5 | <37 | none | 273 | 90.71 |
| 10 | 0.5 | <37 | none | 95 | 92.79 |
| 11 | 1.6 | <37 | none | 270 | 83.87 |
| 12 | 0.7 | <37 | none | 240 | 90.85 |
| 13 | 0.5 | <37 | none | 178 | 88.96 |
| 14 | 0.5 | <37 | none | 571 | 89.4 |
| 15 | 0.5 | <37 | none | 685 | 90.08 |
| 16 | 0.5 | <37 | none | 260 | 91.91 |
| 17 | 0.6 | <37 | none | | |
| 18 | 0.5 | <37 | none | 310 | 91.65 |
| 19 | 0.5 | <37 | none | 278 | 91.7 |
| 20 | 0.5 | <37 | none | 121 | 90.99 |

TABLE 1

| | | | | Deposition parameters | | |
|---|---|---|---|---|---|---|
| Example | Substrate thickness [μm] | power density [kW/m] | substrate speed [cm/min] | reactant flow rate [sccm] | precursor flow rate [sccm] | pressure [mTorr] |
| 1 | 125 | 6.25 | 93 | 399 | 133 | 13 |
| 2 | 125 | 6.25 | 139 | 399 | 133 | 13 |
| 3 | 125 | 6.25 | 279 | 399 | 133 | 13 |
| 4 | 50 | 6.25 | 93 | 399 | 133 | 13 |
| 5 | 50 | 6.25 | 150 | 399 | 133 | 13 |
| 6 | 50 | 6.25 | 279 | 399 | 133 | 13 |
| 7 | 25 | 6.25 | 93 | 399 | 133 | 13 |
| 8 | 25 | 6.25 | 93 | 399 | 133 | 13 |
| 9 | 25 | 6.25 | 93 | 399 | 133 | 13 |
| 10 | 25 | 6.25 | 279 | 399 | 133 | 13 |
| 11 | 25 | 6.25 | 100 | 391 | 130 | 3.8 |
| 12 | 25 | 6.25 | 233 | 890 | 297 | 9.6 |
| 13 | 25 | 6.25 | 139 | 399 | 133 | 13 |
| 14 | 125 | 6.25 | 93 | 399 | 133 | 13 |
| 15 | 50 | 6.25 | 93 | 399 | 133 | 13 |
| 16 | 125 | 6.25 | 93 | 200 | 133 | 13 |
| 17 | 125 | 6.25 | 118 | 1918 | 98.7 | 11 |
| 18 | 125 | 6.25 | 177 | 1918 | 98.7 | 12 |
| 19 | 125 | 6.25 | 355 | 1918 | 98.7 | 12 |
| 20 | 50 | 6.25 | 177 | 1918 | 98.7 | 12 |
| 21 | 50 | 6.25 | 266 | 1918 | 98.7 | 11 |
| 22 | 50 | 6.25 | 532 | 1918 | 98.7 | 11 |
| 23 | 25 | 6.25 | 89 | 1918 | 98.7 | 12 |
| 24 | 25 | 6.25 | 177 | 1918 | 98.7 | 12 |
| 25 | 25 | 6.25 | 532 | 1918 | 98.7 | 12 |
| 26 | 25 | 6.25 | 200 | 1200 | 94.5 | 8.2 |
| 27 | 25 | 6.25 | 333 | 1918 | 156 | 13 |
| 28 | 25 | 6.25 | 266 | 1918 | 98.7 | 13 |
| 29 | 125 | 6.25 | 89 | 1918 | 98.7 | 13 |
| 30 | 50 | 6.25 | 89 | 1918 | 98.7 | 11 |
| 31 | 125 | 6.25 | 177 | 1000 | 98.7 | 6.7 |

TABLE 2-continued

| Example | Power to pressure ratio [(kW/m)/ mTor] | Substrate temperature [° C.] | etching damage | Coating thickness [nm] | Transmittance [D65/2°] |
|---|---|---|---|---|---|
| 21 | 0.6 | <37 | none | 237 | 89.9 |
| 22 | 0.6 | <37 | none | 161 | 87.94 |
| 23 | 0.5 | <37 | none | 90 | 91.33 |
| 24 | 0.5 | <37 | none | 436 | 89.6 |
| 25 | 0.5 | <37 | none | 223 | 88.4 |
| 26 | 0.8 | <37 | none | 87 | 91.19 |
| 27 | 0.5 | <37 | none | 201 | 87.58 |
| 28 | 0.5 | <37 | none | 184 | 88.49 |
| 29 | 0.5 | <37 | none | 156 | 89.94 |
| 30 | 0.6 | <37 | none | 482 | 90.61 |
| 31 | 0.9 | <37 | none | 386 | 89.18 |

The silicon oxide layers of examples 1 to 15 deposited above had a carbon content at or below the detection limit of x-ray photoelectron spectroscopy, when deposited on for comparison on glass samples. The silicon oxide layers of examples 16 to 31 had a carbon content of between 3 and 10 atomic percent. On samples deposited using a power density/pressure ratio of more than 0.5 (kW/m)/mTorr, the carbon content was between 3 and 8 atomic percent.

The distortion of the thin PET substrate, due to stress in the silicon oxide layer, was very low. The coated examples all remained completely flat as observed by the naked eye with the coated sheet placed on a sheet of flat glass.

The invention claimed is:

1. A process for the production of a layer based on silicon oxide on a polymer substrate which is amorphous and homogenous throughout the layer thickness, comprising:

providing the polymer substrate, providing a low-pressure PECVD device comprising at least one linear hollow-cathode plasma source, each source comprising at least one pair of electrodes connected to an AC, DC or pulsed DC generator, for the deposition of said layer on the substrate, applying an electrical power to the at least one linear hollow-cathode plasma source, so that a power density of the plasma is between 1 kW and 50 KW per linear meter of the at least one linear hollow-cathode plasma source, wherein the low-pressure PECVD device is in a vacuum chamber maintained at a pressure between 0.005 and 0.025 Torr, and wherein a ratio of a power per linear meter of the at least one linear hollow-cathode plasma source to the pressure in the vacuum chamber, is not less than 0.2 (kW/m)/mTorr and not greater than 1.5 (kW/m)/mTorr, and applying, to the polymer substrate, a gaseous precursor of oxides of silicon at a flow rate of between 50 and 700 sccm per linear meter of the at least one linear hollow-cathode plasma source, and a reactive gas based on oxygen or on oxygen-comprising derivatives at a flow rate of between 1500 and 4000 sccm per linear meter of the at least one linear hollow-cathode plasma source, wherein the applying the gaseous precursor of oxides of silicon takes place while the polymer substrate is moving between an unwind roll and a main roll, wherein the gaseous precursor of oxides of silicon being injected in between the electrodes of each electrode pair and in between the at least one of the two pairs of electrodes and the reactive gas being injected in the electrodes of the at least one linear hollow-cathode plasma source, wherein the layers based on silicon oxide on the polymer substrate are deposited with a dynamic deposition rate of at least 200 nm×m/min, wherein a substrate temperature remains below 37° C. during the process, and wherein the layer based on silicon oxide has a thickness of from 90 nm to 685 mn and a transmittance (D65/2°) of at least 88%.

2. The process for the production of a layer based on silicon oxide on a polymer substrate according to claim 1, wherein the reactive gas is selected among pure $O_2$ and a mixture of $O_2$ and an inert gas mixture, wherein a ratio of a flow rate of $O_2$ to a flow rate of the inert gas is between 2 and 50.

3. The process for the production of a layer based on silicon oxide on a polymer substrate according to claim 1, wherein the gaseous precursor of oxides of silicon is selected among $SiH_4$, TMDSO and HMDSO.

4. The process for the production of a layer based on silicon oxide on a polymer substrate according to claim 1, wherein electrical power is applied to the at least one linear hollow-cathode plasma source, so that the power density of the at least one linear hollow-cathode plasma is between 2 kW and 30 kW per linear meter of plasma source.

5. The process for the production of a layer based on silicon oxide on a polymer substrate according to claim 1, wherein the flow rate of the gaseous precursor of oxides of silicon is between 150 and 500 sccm per linear meter of the at least one linear hollow-cathode plasma source.

6. The process for the production of a layer based on silicon oxide on a polymer substrate according to claim 1, wherein electrical power is applied to the at least one linear hollow-cathode plasma source, so that the power density of the plasma is between 3 kW and 15 KW per linear meter of the at least one linear hollow-cathode plasma source.

7. The process for the production of a layer based on silicon oxide on a polymer substrate according to claim 1, wherein the flow rate of the gaseous precursor of oxides of silicon is between 200 and 500 sccm per linear meter of the at least one linear hollow-cathode plasma source.

8. A process for producing a silicon oxide layer on a moving polymer substrate which is amorphous and homogeneous throughout the layer thickness, comprising:

providing the moving polymer substrate, providing a PECVD device in a vacuum chamber maintained at a pressure between 0.005 and 0.025 Torr comprising at least one linear hollow-cathode plasma source, each source comprising at least one pair of electrodes connected to an AC, DC or pulsed DC generator, for the deposition of said layer on the substrate, applying an electrical power to the at least one linear hollow-cathode plasma source, so that a power density of the plasma is between 1 kW and 30 kW per linear meter of at least one linear hollow-cathode plasma source, wherein the low-pressure PECVD device is in a vacuum chamber maintained at a pressure between 0.005 and 0.025 Torr, and wherein a ratio of a power per linear meter of the at least one linear hollow-cathode plasma source to the pressure in the vacuum chamber, is not less than 0.2 (kW/m)/mTorr and not greater than 1.5 (kW/m)/mTorr, and applying, to the moving polymer substrate, a gaseous precursor of oxides of silicon at a flow rate of between 50 and 700 sccm per linear meter of the at least one linear hollow-cathode plasma source, and a reactive gas based on oxygen or on oxygen-comprising derivatives at a flow rate of between 1500 and 4000 sccm per linear meter of the at least one linear hollow-cathode plasma source, wherein the applying the gaseous precursor of oxides of silicon takes place while the polymer substrate is moving between an unwind roll and a main roll, wherein the gaseous precursor of oxides of silicon being injected in between the electrodes of each electrode pair and in between the at least one of the two pairs of electrodes and the reactive gas being injected in the electrodes of the at least one linear hollow cathode plasma source, wherein the silicon oxide layer on the polymer substrate is deposited with a dynamic deposition rate of at least 200 nm×m/min, wherein a substrate temperature remains below 37° C. during the process, and wherein the silicon oxide layer has a thickness of from 90 nm to 685 nm and a transmittance (D65/2°) of at least 88%.

9. The process for producing a silicon oxide layer on a moving polymer substrate according to claim 8, wherein the reactive gas is selected among pure $O_2$ and a mixture of $O_2$ and an inert gas mixture, wherein a ratio of a flow rate of $O_2$ to a flow rate of the inert gas is between 2 and 50.

10. The process for producing a silicon oxide layer on a moving polymer substrate according to claim 8, wherein the gaseous precursor of oxides of silicon is selected among $SiH_4$, TMDSO and HMDSO.

11. The process for producing a silicon oxide layer on a moving polymer substrate according to claim 8, wherein electrical power is applied to the at least one linear hollow-cathode plasma source, so that the power density of the plasma is between 2 kW and 30 KW per linear meter of plasma source.

12. The process for producing a silicon oxide layer on a moving polymer substrate according to claim 8, wherein the flow rate of the gaseous precursor of oxides of silicon is between 150 and 500 sccm per linear meter of the at least one linear hollow-cathode plasma source.

13. The process for producing a silicon oxide layer on a moving polymer substrate according to claim 8, wherein electrical power is applied to the at least one linear hollow-cathode plasma source, so that the power density of the plasma is between 3 kW and 15 KW per linear meter of the at least one linear hollow-cathode plasma source.

14. The process for producing a silicon oxide layer on a moving polymer substrate according to claim 8, wherein the polymer substrate is a PET substrate.

15. A process for the production of a layer based on silicon oxide on a polymer substrate which is amorphous and homogeneous throughout the layer thickness, comprising:

providing the polymer substrate, providing a low-pressure PECVD device comprising at least one linear hollow-cathode plasma source, each source comprising at least one pair of electrodes connected to an AC, DC or pulsed DC generator, for the deposition of said layer on the substrate, applying an electrical power to the at least one linear hollow-cathode plasma source, so that a power density of the plasma is between 1 kW and 50 kW per linear meter of the at least one liner hollow-cathode plasma source, wherein the low-pressure PECVD device is in a vacuum chamber maintained at a pressure between 0.005 and 0.025 Torr, and wherein a ratio of a power per linear meter of the at least one linear hollow-cathode plasma source to the pressure in the vacuum chamber, is not less than 0.2 (kW/m)/mTorr and not greater than 1.5 (kW/m)/mTorr, and applying, to the polymer substrate, a gaseous precursor of oxides of silicon at a flow rate of between 50 and 700 sccm per linear meter of the at least one linear hollow-cathode plasma source, and a reactive gas based on oxygen or on oxygen-comprising derivatives at a flow rate of between 1500 and 4000 sccm per linear meter of the at least one linear hollow-cathode plasma source, wherein the gaseous precursor of oxides of silicon being injected in between the electrodes of each electrode pair and in between the at least one of the two pairs of electrodes and the reactive gas being injected in the electrodes of the at least one linear hollow-cathode plasma source, wherein the polymer substrate is maintained at a temperature of 60° C. or less, and wherein the layer based on silicon oxide has a thickness of from 90 nm to 685 nm and a transmittance (D65/2°) of at least 88%.

16. The process for the production of a layer based on silicon oxide on a moving polymer substrate according to claim 1, wherein the gaseous precursor of oxides of silicon comprises carbon and hydrogen and the amount of oxygen or oxygen comprising derivatives is at least sufficient to transform all carbon, hydrogen and/or silicon of the precursor into $CO_2$, $H_2O$ and $SiO_2$ according to the formula:

$$q=2x+0.5y+2z$$

whereas q: amount of oxygen atoms provided;

x: the carbon containing portion of the precursor;

y: the hydrogen containing portion of the precursor;

z: the silicon containing portion of the precursor.

17. The process for the production of a layer based on silicon oxide on a moving polymer substrate according to claim 1, wherein a ratio of a power per linear meter of the at least one linear hollow-cathode plasma source to the pressure in the vacuum chamber, is not less than 0.5 (kW/m)/mTorr and not greater than 0.9 (kW/m)/mTorr.

18. The process for the production of a layer based on silicon oxide on a moving polymer substrate according to claim 17, wherein a polymer substrate temperature remains below 37° C. during the process in an absence of additional polymer substrate cooling means.

19. The process for the production of a layer based on silicon oxide on a moving polymer substrate according to claim 1, wherein the polymer substrate remained flat and was not subjected to etching damage as a result of the process.

* * * * *